United States Patent [19]

Schäfer

[11] 3,928,225

[45] Dec. 23, 1975

[54] GLASS FORMING MIXTURE WITH BORON AS THE DOPING MATERIAL FOR PRODUCING CONDUCTIVITY ZONES IN SEMICONDUCTOR BODIES BY MEANS OF DIFFUSION

[75] Inventor: Horst Schäfer, Wendelstein, Germany

[73] Assignee: SEMIKRON Gesellschaft fur Gleichrichterbau und Electronik m.b.H., Nurnburg, Germany

[22] Filed: Apr. 4, 1972

[21] Appl. No.: 241,070

[30] Foreign Application Priority Data

Apr. 8, 1971 Germany ........ 2117179

[52] U.S. Cl. ........ 252/182; 106/52; 106/54; 148/188; 427/85

[51] Int. Cl.[2] ........ H01L 7/44

[58] Field of Search ........ 148/188; 106/54, 52; 117/212; 252/182; 427/85

[56] References Cited

UNITED STATES PATENTS

| | | | |
|---|---|---|---|
| 3,084,079 | 4/1963 | Harrington | 148/1.5 |
| 3,300,339 | 1/1967 | Perri et al. | 117/212 |
| 3,615,943 | 10/1971 | Genser | 148/188 |
| 3,637,425 | 1/1972 | McMillan et al. | 117/125 |

*Primary Examiner*—John D. Welsh

*Attorney, Agent, or Firm*—Spencer & Kaye

[57] ABSTRACT

On a semiconductor body, a doping composition consisting essentially of a component for providing boron diffusible into the semiconductor body, an organic polymerizable component for providing semiconductor oxide upon heating, a component for forming with the boron providing component and the semiconductor oxide providing component, upon heating, a glass having the coefficient of thermal expansion of the semiconductor body, and an organic solvent component, containing as solutes the boron providing component, the semiconductor oxide providing component, and the forming component, for wetting the semiconductor body and for maintaining substantially constant solute concentrations over extended times.

16 Claims, No Drawings

GLASS FORMING MIXTURE WITH BORON AS THE DOPING MATERIAL FOR PRODUCING CONDUCTIVITY ZONES IN SEMICONDUCTOR BODIES BY MEANS OF DIFFUSION

BACKGROUND OF THE INVENTION

The present invention relates to a doping composition for producing diffusion doping when in contact with a semiconductor body.

To produce conductivity zones in semiconductor bodies by doping through diffusion it is known to subject the semiconductor material to a stream of gas at an appropriate temperature, the gas consisting of a carrier gas, for example nitrogen and/or oxygen, and a gaseous doping material or a gaseous compound of the same. The diffusion of the doping material, which is also called the impurity material, takes place over the entire surface of the semiconductor exposed to the gas stream, as a function of the thermodynamics for the diffusion process.

In another known process for doping semiconductor material by means of diffusion, the impurity material is sprayed or spread onto the, for example, wafer-type semiconductor body in a liquid or paste-type composition. The semiconductor wafers which have been pretreated according to this so-called paint-on technique are then heated in groups to the temperature required for the intended diffusion process. If necessary it is possible to simultaneously produce at the areas of the semiconductor wafer which are to be doped zones with different conductivity types by means of the diffusion of suitable doping materials.

For this purpose, the impurity materials employed are, in known manner, elements of groups 3*a* and 5*a* of the Periodic Table of the Elements as appearing, for example, on the inside of the back cover of the 49th edition of the Handbook of Chemistry and Physics, The Chemical Rubber Co., Cleveland, Ohio (1968). When silicon is used as the semiconductor material, boron in the form of boron trioxide is suitable for producing p-conductive zones, for example, and for producing n-conductive zones, phosphorus in the form of phosphorus pentoxide is preferred. In the paint-on technique, these doping materials are applied to the intended semiconductor surface in the form of oxides in advantageous solutions to produce simultaneous diffusion.

These oxides in particular, or compounds of arsenic — another element preferred as impurity material — and oxygen in the form of $As_2O_3$ and $As_2O_5$ are also known in the semiconductor art as so-called glass formers. In the course of the diffusion process, they form a glass-type coating together with the oxide of the semiconductor material occurring on the semiconductor surface in the presence of oxygen.

When semiconductor wafers are doped with boron on one side in the paint-on technique and with phosphorus as the impurity material on the opposite side, it has been found that the different coefficients of thermal expansion of the glass layers formed at the diffusion temperature effect a stronger contraction of the boron glass layer with respect to the semiconductor material when the semiconductor wafers are being cooled after the diffusion process, so that undesired curvatures are produced in the semiconductor wafer. This phenomenon often leads to microscopic cracks and thus to contacting difficulties and, if the microscopic cracks extend into the space charge area, causes malfunctioning of the semiconductor component.

Reduction of the boron content of the boron glass layer produces a reduction but not an elimination of the deformation and moreover unduly reduces the concentration of the impurity material.

SUMMARY OF THE INVENTION

An object of the present invention, therefore, is to produce a glass layer on the semiconductor surface, while using boron as the doping material and maintaining the impurity concentration which assures the desired function of the elements, where the coefficient of thermal expansion of the glass layer is substantially adapted to that of the semiconductor material.

This as well as other objects which will become apparent in the discussion that follows are achieved, according to the present invention, by providing on a semiconductor body, a doping composition consisting essentially of means for providing boron diffusible into the semiconductor body, organic polymerizable means for providing semiconductor oxide upon heating, means for forming with the boron providing means and the semiconductor oxide providing means, upon heating, a glass having the coefficient of thermal expansion of the semiconductor body, and organic solvent means, containing as solutes the boron providing means, the semiconductor oxide providing means, and the forming means, for wetting the semiconductor body and for maintaining substantially constant solute concentrations over extended times.

GENERAL ASPECTS OF THE INVENTION

The addition of a glass forming compound of the semiconductor material to the doping material before the diffusion process, in order to produce, in addition, an oxide of the semiconductor material for the glass formation, did not lead to the desired advantageous result.

It is known to vary the properties of glass by the addition of metal oxides. Thus, for example, the coefficient of thermal expansion of a glass can be varied by the addition of $Al_2O_3$. However, it should be particularly considered when forming glass layers during the doping of semiconductor material by means of diffusion that no metal oxides must be used to vary the properties of the glass type coating which would adversely influence those semiconductor material physical properties which are required for the desired function of the intended semiconductor component. For example, the metals iron, gold, copper, zinc and manganese may shorten the life of the substrate due to the formation of recombination centers.

It has surprisingly been found in experiments that the addition of nickel, in suitable form, together with the addition of a suitable compound of the semiconductor material, to the impurity material cancels out the disadvantageous deformation during cooling previously experienced in semiconductor wafers after a paint-on diffusion process.

A method for producing semiconductor arrangements with pn-junctions is known in which a known glass forming compound, containing impurity material as a component, is applied and then the diffusion into the semiconductor surface is carried out. This results in a glass-type coating on the particular semiconductor body area where the glass former was applied. Such coatings represent, on the one hand, a deposit for the respective doping material and, on the other hand, depending on the type of semiconductor component intended, they may also serve as a protective layer and/or electrical insulation coating for the semiconductor body. The glazing material with a doping substance as a component in the known processes is boron trioxide $B_2O_3$. The use of this material without additional measures, however, produces the above-described undesirable deformations on the semiconductor wafer. These deformations are prevented with the composition according to the present invention.

The present invention relates to a glass forming mixture containing boron as the doping material for producing conductivity zones in semiconductor bodies by means of diffusion. In addition to a boron-containing first component a second component is present in the mixture. This second component contains a metal which influences the properties of the glass layers to be formed. Also present is an organic, polymerizable third component comprising a compound with a semiconductive element. The second and third components are present in proportions determined relative to the boron proportion. The first, second, and third components are dissolved in an organic solvent with low vapor pressure and good wetting ability on the semiconductor body to be doped.

DESCRIPTION OF THE PREFERRED EMBODIMENTS

For reasons relating to the process itself $B_2O_3$ is preferred as the boron containing component. Its proportion and thus the proportion of doping material in the mixture is determined from the impurity concentration desired for the conductivity zones. Its upper limit is determined by saturation in the solvent.

Instead of nickel, other materials known in the glass art which do not adversely influence the properties of the semiconductor material, such as lead, calcium and tin, for example, can be used as the second metallic component.

In order to eliminate undesirable ancillary effects during the diffusion process, these metals are applied in the particularly suitable, preferred form of metal salts of organic acids. When nickel is used, nickel acetate is the preferred metal salt of an organic acid. Nickel acetate produces, at a temperature required in the process sequence, nickel oxide, which together with the doping material boron and the semiconductor material, assures the formation of the glass-type coating with the desired physical properties.

The proportion of nickel in the mixture depends, since the undesired bending of the semiconductor wafers always changes directly with the quantity of doping material present, on the proportion of the latter. With a predetermined, uniform surface impurity concentration, the ratio weight of nickel acetate to weight of boron trioxide equals about 0.7 to 1.2, weight of boron trioxide to weight of solvent equals about 0.05 to 0.08, give glass layers with the desired properties.

In order to assure suitable viscosity of the mixture, even after the addition of nickel, for application and adhesion of the mixture on the semiconductor body, the nickel salt may be dissolved in a solvent, for example in acetic acid.

As above mentioned, the mixture according to the present invention has a third component, this being preferrably a suitable compound of the semiconductor material to be doped. When silicon is used and the corresponding compound is silicon dioxide, there only results a suspension in the mixture due to the finely powdered state of this material, which may be a drawback for the process. Thus an organic compound of the semiconductor material is preferred for the third component. In the case of silicon, a silicic acid ester is preferred, the silicic acid ester being easily soluble in the solvent used for the mixture. Several other silicon compounds do not appear to be suitable because halogen components contained therein may adversely influence the semiconductor material in the course of diffusion process. Thus, it is preferred to use a halogen-free silicic acid ester. Silicic acid ester polymerizes at higher temperatures to form $SiO_2$.

The proportion of this third component is not critical. However, its upper limit is determined by the requirement that an excess of semiconductor oxide not unduly reduce the doping material concentration on the semiconductor surface.

The addition of a semiconductor material compound to the mixture appears to assure the required amount of semiconductor oxide for the desired glass layer.

When silicon is used for the semiconductor body to be doped, favorable results are obtained, for example, with tetraethylorthosilicate as the silicic acid ester. Under consideration of the above-mentioned ranges for the mixing of boron trioxide, nickel acetate and solvent, glass layers with the desired properties could be produced, under conditions of constant surface concentration of the doping material, by an addition of 0.13 to 0.40 parts by weight tetraethylorthosilicate per part by weight of the solvent.

The solvent for producing the galss forming mixture according to the present invention has a plurality of organic components. Ethylene glycol or ethylene glycol monomethyl ether is advantageously used to dissolve the boron containing first component. These materials assure a doping material concentration of the solution which remains constant over extended times due to their low vapor pressures; they completely evaporate during the diffusion process, do not adversely influence the properties of the semiconductor material and show a favorable behavior with respect to wetting during the application of the mixture on the semiconductor surface.

Lactic acid is used to reduce the polymerizing temperature of the silicic acid ester to room temperature since the normal polymerizing temperature of the silicic acid ester is unfavorable for the process.

Ethanol (ethyl alcohol) is also added, to further the wetting of the semiconductor surface, particularly in view of the high surface tension of the silicic acid ester.

Due to rapid polymerization with the help of the lactic acid, there is produced, in an advantageous manner, a gel-like layer right when the mixture is applied to the semiconductor surface. From this gel-type layer, the above-mentioned solvent components evaporate at temperatures up to about 200°C. At approximately 400°C the boron containing component begins to melt and with a further increase in temperature it begins to dissolve the silicon dioxide produced from the silicic acid ester. When the intended diffusion temperature has been reached, a glass layer consisting essentially of the oxides of the doping material, the metallic second component, and the semiconductor material of the third component is produced independently of the production of semiconductor oxide by oxidation of the semiconductor body to be doped. This glass layer simultaneously constitutes a deposit of impurity material in the desired concentration and has the required properties when it is cooled.

The proportions of the solvent components are not critical. Favorable results were obtained with a mixture of ethylene glycol monomethyl ether, lactic acid, and ethanol at a volume ratio of 33:6:28.

The use of lactic acid, the component which enhances polymerization, has the further advantage that the semiconductor wafers can be stacked in the diffusion apparatus in larger numbers without the need for intermediary layers and without sticking together.

The use of the glass-forming mixture according to the present invention has further shown that the impurity concentration in the surface layer of the semiconductor wafers is higher than for wafers treated with a conventional doping mixture. This increase in concentration can be explained by the correspondingly improved chemical bonding of the doping material with the other components of the mixture according to the present invention in the course of the diffusion process and by the resulting larger supply of the doping material for diffusion. The proportion of doping material in the mixture thus remains intact during the glass formation to a larger extent than heretofore possible. This produces the further significant advantage of the present invention that for different semiconductor circuit elements requiring different impurity concentrations depending upon their respective functions, the impurity concentration can be predetermined by the proportion of doping material in the mixture. For example, in order to assure on the surface of a semiconductor wafer to be used as a silicon rectifier a maximum impurity concentration of at least $10^{21}$ atoms/cm$^3$ at a diffusion temperature of 1270°C, the following composition of the mixture has been found to be suitable:

0.06 parts by weight $B_2O_3$, 0.055 parts by weight nickel acetate, and 0.25 parts by volume tetraethyl orthosilicate per 1 part by volume solvent.

The mixture according to the present invention can be applied, for example, by metered spraying or by depositing a predetermined number of drops on a wafer and then rotating the wafer to spread the mixture. Directly after application the mixture forms a well adhering, pre-polymerized layer with a predetermined content of doping material. During cooling from diffusion temperature, it forms a glass layer with the desired physical characteristics with respect to the semiconductor material. This glass layer is practically not influenced in its formation and composition by the semiconductor oxide produced by oxidation during the diffusion process on the semiconductor wafer. The mixture according to the present invention further assures in an advantageous manner, in that its content of doping material can be selected, a predetermined starting impurity concentration for the intended function of the semiconductor wafer.

With reference to the above example containing 0.06 parts by weight $B_2O_3$, 0.055 parts by weight nickel acetate, and 0.25 parts by volume tetraethyl orthosilicate per 1 part by volume solvent, the ratio weight of $B_2O_3$ to weight of solvent was 6 : 90, while the ratio weight of tetraethyl orthosilicate to weight of solvent was 23 : 93.

The solvent was a mixture of ethylene glycol monoethyl ether, lactic acid, and ethanol at a volume ratio 33:6:28. This composition was used on a silicon wafer having a diameter of 1½ inch and a thickness of 0.012 inch for example. The composition was sprayed on the surface of the wafer and following the wafer was rotated with 2000 revolutions per minute to spread the mixture. The diffusion process was effected at a temperature of 1250°C over approximate 10 hours. The furnace atmosphere was dry air.

No warping or cracking of the wafer is observed under these conditions.

It will be understood that the above description of the present invention is susceptible to various modifications, changes, and adaptations, and the same are intended to be comprehended within the meaning and range of equivalents of the claims.

I claim:

1. A glass-forming composition for doping a silicon semiconductor body with boron to produce conductivity zones in the semiconductor body by diffusion, said composition consisting essentially of boron trioxide as a boron doping compound in an amount effective to provide a conductivity zone, a polymerizable organic compound of a silicon semiconductor which provides an oxide of said semiconductor upon heating, said polymerizable organic compound being a silicic acid ester, and a metal salt of an organic acid which modifies the thermal expansion properties of the glass without adversely affecting the properties of the semiconductor body, the proportion of said metal salt to said boron trioxide providing a glass having a coefficient of thermal expansion of said semiconductor body, the metal of said metal salt being selected from the group consisting of nickel, lead, calcium and tin, and said composition being dissolved in a solvent which has a low vapor pressure and is capable of wetting said semiconductor body.

2. A glass-forming doping composition as claimed in claim 1 wherein the metal salt is nickel acetate.

3. A glass-forming doping composition as claimed in claim 2 wherein the weight ratio of nickel acetate to boron trioxide is 0.7 to 1.2 and the weight ratio of boron trioxide to said solvent is 0.05 to 0.08.

4. A glass-forming doping composition as claimed in claim 4 wherein the weight ratio of boron trioxide to solvent is 0.05 to 0.08 and said ester is present at 0.13 to 0.40 parts by weight per one part by weight of said solvent.

5. The glass-forming composition as claimed in claim 1 wherein the metal of said metal salt is nickel.

6. The glass-forming composition as claimed in claim 1 wherein the metal of said metal salt is tin.

7. The glass-forming composition as claimed in claim 1 wherein the metal of said metal salt is lead.

8. The glass-forming composition as claimed in claim 1 wherein the metal of said metal salt is calcium.

9. In a method of doping a semiconductor body with boron to produce conductivity zones in the semiconductor body by diffusion by applying to the semiconductor body a glass-forming composition which consists essentially of boron trioxide as a boron doping compound in an amount effective to provide a conductivity zone, a polymerizable organic compound of a silicon semiconductor which provides an oxide of said silicon semiconductor upon heating, said polymerizable organic compound being a silicic acid ester, and a solvent for said boron trioxide and said polymerizable organic compound, said solvent having a low vapor pressure and being capable of wetting said semiconductor body, the improvement comprising: providing in said glass-forming composition a metal salt of an organic acid which modifies the thermal expansion properties of the glass without adversely affecting the properties of the semiconductor body, the proportion of said metal salt to said boron trioxide providing a glass having a coefficient of thermal expansion of said semiconductor body, and the metal of said metal salt being selected from the group consisting of nickel, lead, calcium and tin.

10. The method of claim 9 wherein the metal salt is nickel acetate.

11. The method of claim 10 wherein the weight ratio of nickel acetate to boron trioxide is 0.7 to 1.2 and the weight ratio of boron trioxide to said solvent is 0.05 to 0.08.

12. The method of claim 10 wherein said organic semiconductor compound is a silicic acid ester, the weight ratio of boron trioxide to solvent is 0.05 to 0.08 and said ester is present at 0.13 to 0.40 parts by weight per one part by weight of said solvent.

13. The method of claim 9 wherein the metal of said metal salt is nickel.

14. The method of claim 9 wherein the metal of said metal salt is tin.

15. The method of claim 9 wherein the metal of said metal salt is lead.

16. The method of claim 9 wherein the metal of said metal salt is calcium.

* * * * *